(12) United States Patent
Fan et al.

(10) Patent No.: US 6,914,445 B2
(45) Date of Patent: Jul. 5, 2005

(54) MODULAR SOCKET FOR TESTING AN INTEGRATED CIRCUIT

(76) Inventors: Wei-Fang Fan, No. 46, Lane 1448, Jong Hwa Rd., Jwu Deci City (TW); Wann-Chyuan Jou, No. 18, Lane 49, Shan Jeau Rd., Sec. 1, Ell Shoei Country (TW)

( * ) Notice: Subject to any disclaimer, the term of this patent is extended or adjusted under 35 U.S.C. 154(b) by 144 days.

(21) Appl. No.: 10/235,721

(22) Filed: Sep. 6, 2002

(65) Prior Publication Data

US 2004/0046583 A1 Mar. 11, 2004

(51) Int. Cl.[7] ............................................. G01R 31/06
(52) U.S. Cl. ..................................... 324/755; 324/765
(58) Field of Search ............................... 324/754–755, 324/765, 760; 439/62–72, 91; 438/14–18

(56) References Cited

U.S. PATENT DOCUMENTS 5,940,278 A * 8/1999 Schumacher ................. 361/769
5,955,888 A * 9/1999 Frederickson et al. ....... 324/761
6,489,790 B1 * 12/2002 An et al. ..................... 324/755

* cited by examiner

Primary Examiner—Vinh P. Nguyen
(74) Attorney, Agent, or Firm—Dennison, Schultz, Dougherty & MacDonald

(57) ABSTRACT

A modular socket is designed to facilitate the testing of an integrated circuit and is formed of a base unit, an interposer, a POGO pin unit, and an adapter unit. The base unit is provided with a plurality of contact terminals which are electrically connected with the interposer. The interposer is provided with a plurality of pin holes for holding a plurality of elastic pins of the POGO pin unit such that one end of the elastic pins is extended into an integrated circuit seat of the adapter unit, thereby enabling the pins of the integrated circuit to be electrically connected with the contact terminals via the elastic pins in conjunction with the interposer. The modular socket is versatile in design in that it can be used for the testing of integrated circuit of various specifications.

8 Claims, 9 Drawing Sheets

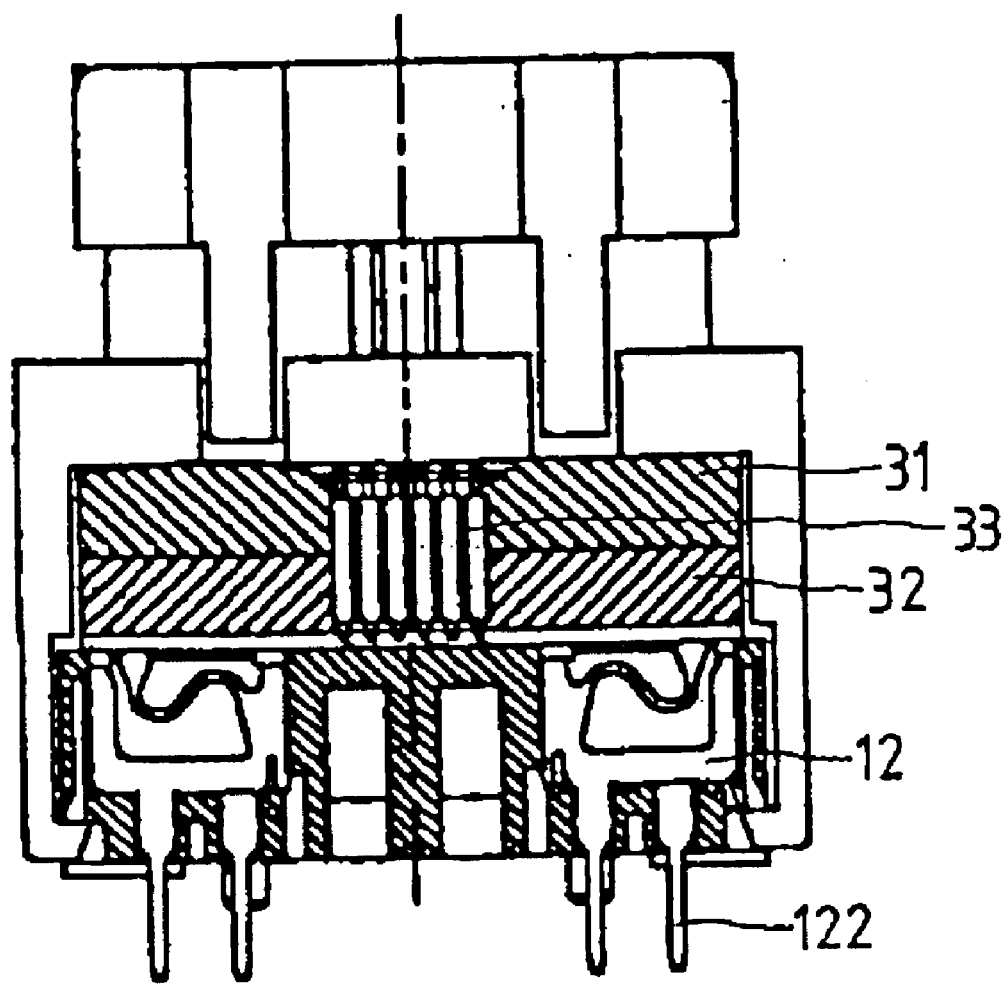
Fig · 5
B- B'

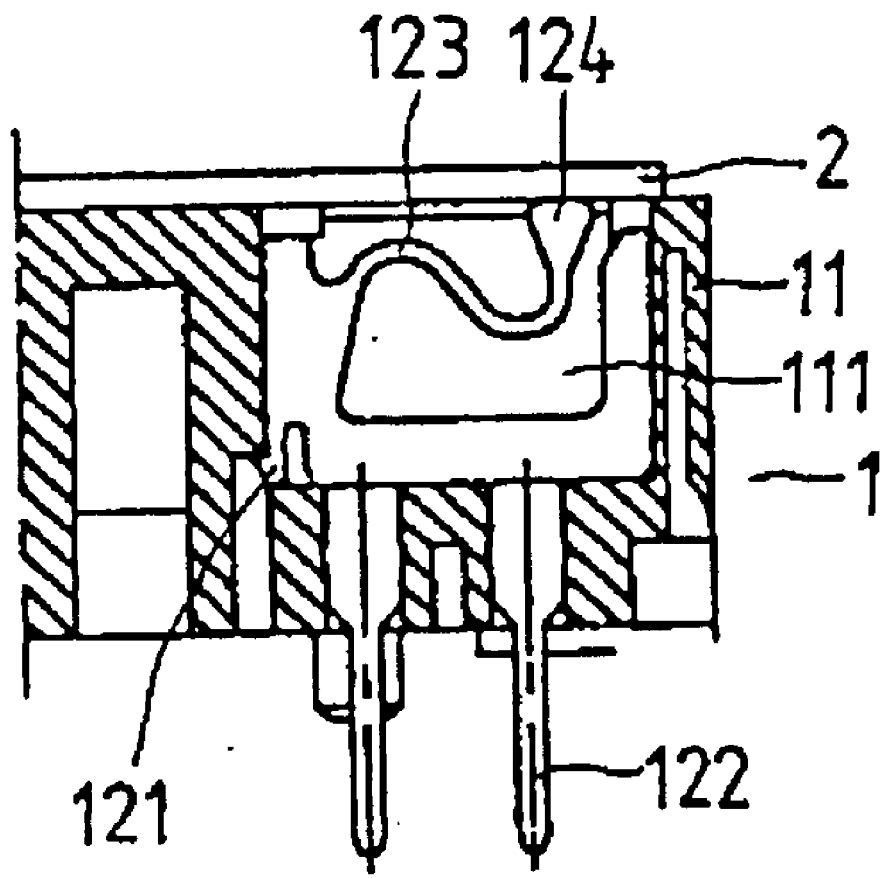
Fig • 6

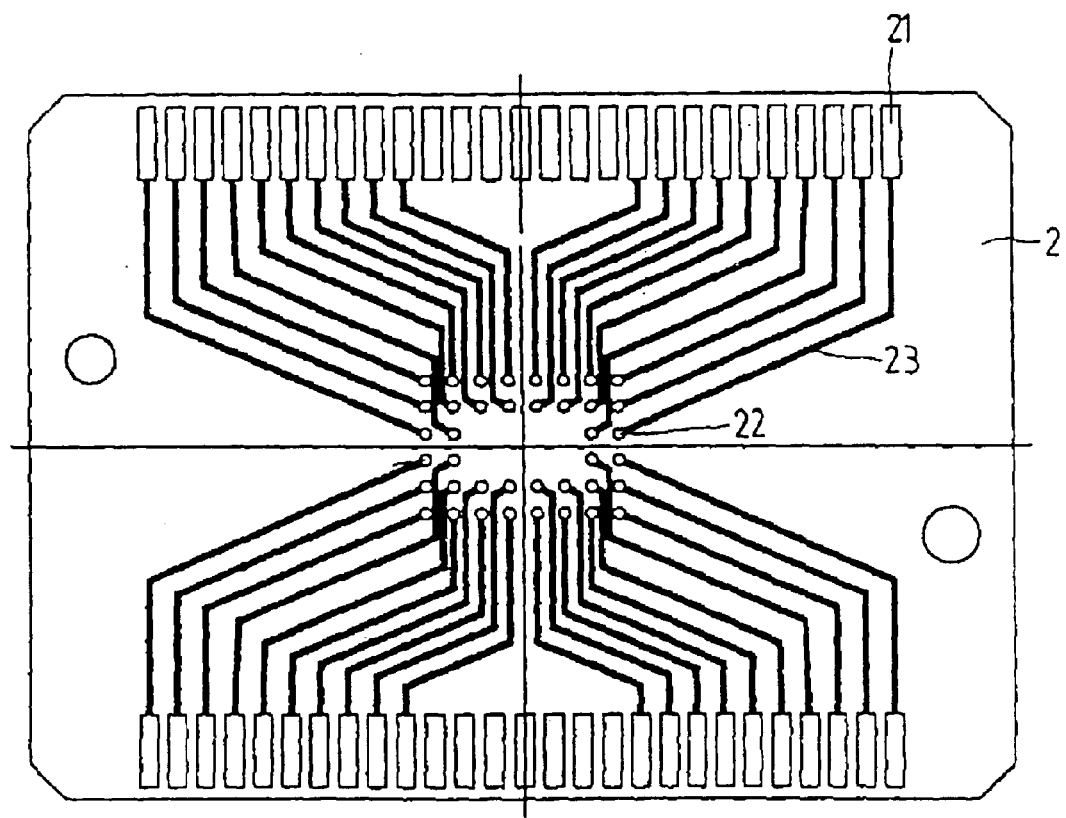
Fig • 7

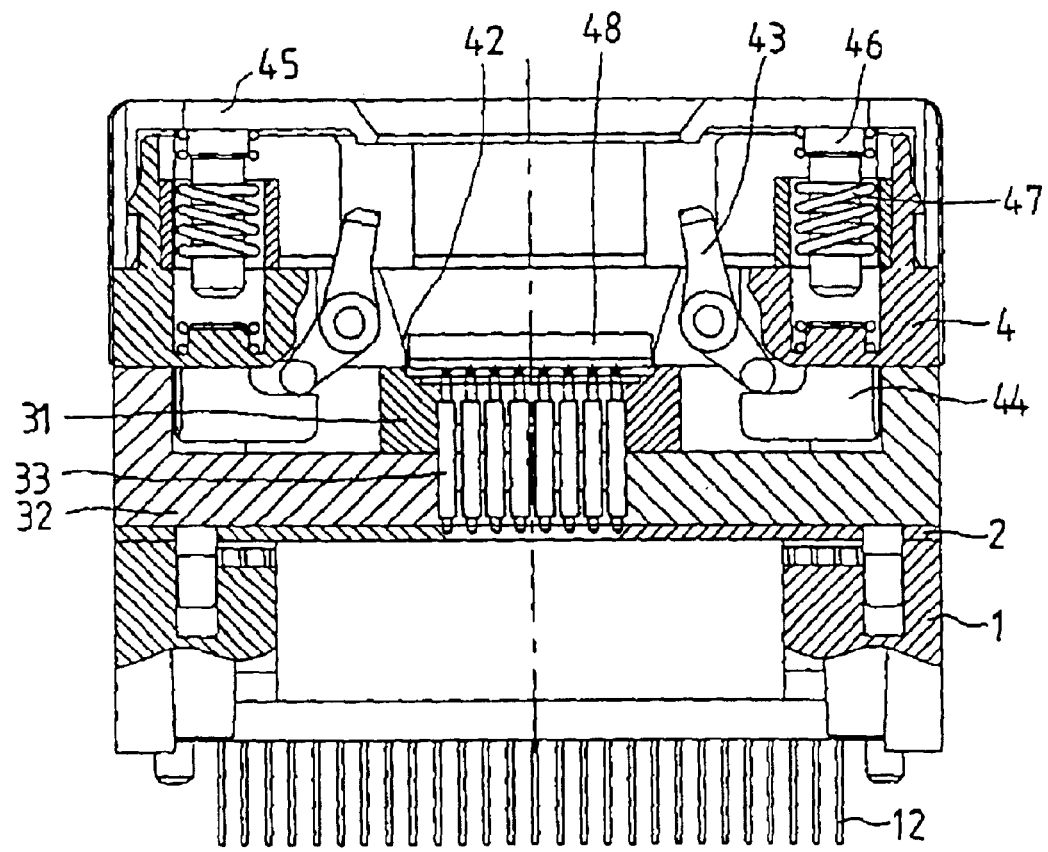
Fig · 8

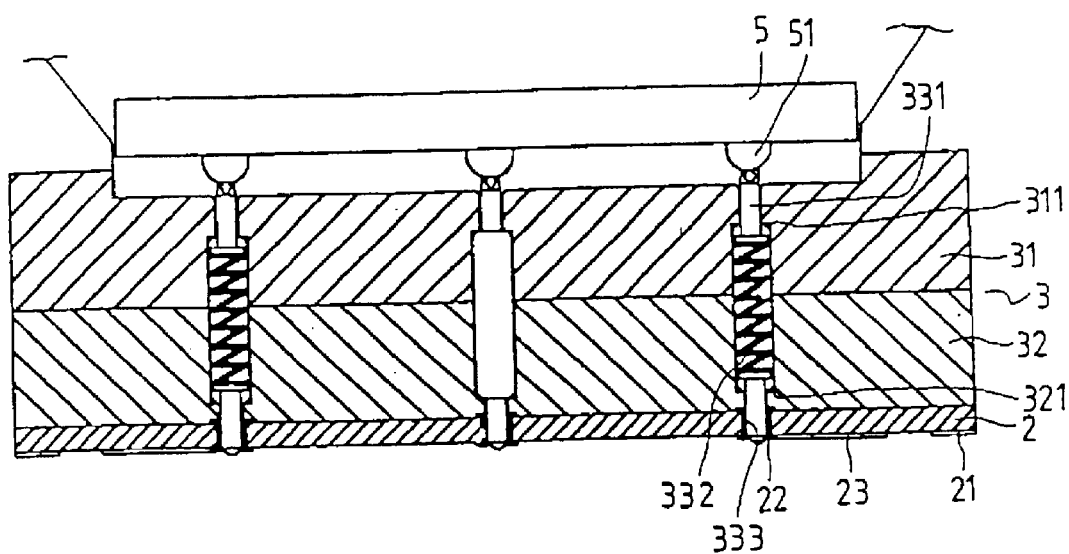
Fig · 9

MODULAR SOCKET FOR TESTING AN INTEGRATED CIRCUIT

FIELD OF THE INVENTION

The present invention relates generally to an IC socket, and more particulary to a modular IC socket which is packaged by ball grid array (BGA).

BACKGROUND OF THE INVENTION

The development of the nanometer technology marks the beginning of a new era in the history of the integrated circuit, with the implication being that the change in the service life span of the future integrated circuit becomes greater, and that the weight of the future integrated circuit becomes lighter, and that the dimension of the future integrated circuit becomes smaller by intensifying the concentration of pins. In spite of the technological sophistication of the integrated circuit, the commercial value of the integrated circuit in itself is mute. In another words, the integrated circuit must be so packaged as to become a versatile product with a value which is often promoted by a specific brand name. Similarly, the current technological development of the state-of-the-art products, such as PDA, digital camera, notebook computer, GSP, etc., accentuates the advancement in miniaturization and versatility of the products.

The preparation of the integrated circuit involves the circuit design, the wafer fabrication, the wire bonding, the packaging, and the reliability test, thereby resulting in an end product of the so-called circuit element. In the course of wafer level and component level, the burn-in test is used as the primary reliability test. As far as the IC packaging technology is concerned, the integrated circuit is generally packaged by ball grid array (BGA).

The ball grid array packaging technology is relatively efficient in concentrating the pins, thereby resulting in an enhancement in miniaturization and versatility of the integrated circuit. A reliability test was successfully developed in 1997 by Intel Corporation of the United States for testing a component which was packaged by ball grid array. The large-scale production of flash memory was a case in point. The production of dynamic random access memory (DRAM) or direct rambus DRAM also involves the BGA packaging technology described above.

The burn-in test involves the usage of a specifically designed IC socket or connector for testing the vulnerability of deformation of pins or tin balls upon impact, as well as the excessively high contact impedance or short circuit. In addition, the test must be done to study the influence of the environmental temperature and relative humidity on the insulation resistance of the pins or tin balls. Similarly, the test must be carried out to understand the stability of induction and capacitance of the pins or tin balls within a predetermined range, and the relationship between the energy consumption and the ineptness of the pins or tin balls.

As shown in FIG. 1, the conventional IC socket or connector is fixed in conjunction with the circuit design. For example, the central processing unit and the memory are mounted fixedly on a printed circuit board. As far as the IC burn-in test is concerned, the socket is mounted fixedly. In another words, the conventional socket is not compatible with a burn-in test that is intended to test an integrated circuit with a different function. As a result, a variety of sockets must be provided for testing the integrated circuit various in function.

In light of the conventional IC socket being fixed with the printed circuit board, the socket must be replaced in its entirety in the event that the socket is partially damaged or defective. In addition, the IC specification is limited by the conventional socket. Furthermore, the conventional socket can not be used repeated for testing the integrated circuits of different designs and functions. The conventional socket is no longer suitable for use in the testing of an integrated circuit containing numerous pins which are arranged at a minute pitch. In short, the conventional IC socket is obsolete and is not cost-effective.

SUMMARY OF THE INVENTION

The primary objective of the present invention is to provide a modular IC socket which is free of the deficiencies of the conventional IC socket described above.

In keeping with the principle of the present invention, the foregoing objective of the present invention is attained by the modular IC socket comprising a base unit, an interposer, a POGO pin unit, and an adapter unit. The base unit comprises a base and a plurality of contact terminals. The interposer is mounted on the base such that the interposer is electrically connected with the contact terminals. The interposer is provided with a plurality of pin holes. The POGO pin unit is mounted on the interposer and is provided with a plurality of elastic pins, which come in contact with the pin holes of the interposer. The adapter unit is mounted on the POGO pin unit and is provided with an IC mount. The top ends of the elastic pins are extended into the IC mount of the adapter unit. In operation, an integrated circuit to be tested is disposed on the IC mount of the adapter unit such that the pins of the integrated circuit are electrically connected to the contact terminals of the base unit via the elastic pins in conjunction with the guidance of the interposer. The base unit, the interposer, the POGO pin unit, and the adapter unit are detachably arranged together.

The features, functions, and advantages of the present invention will be more readily understood upon a thoughtful deliberation of the following detailed description of a preferred embodiment of the present invention with reference to the accompanying drawings.

DETAILED DESCRIPTION OF THE DRAWINGS

Figure 1:
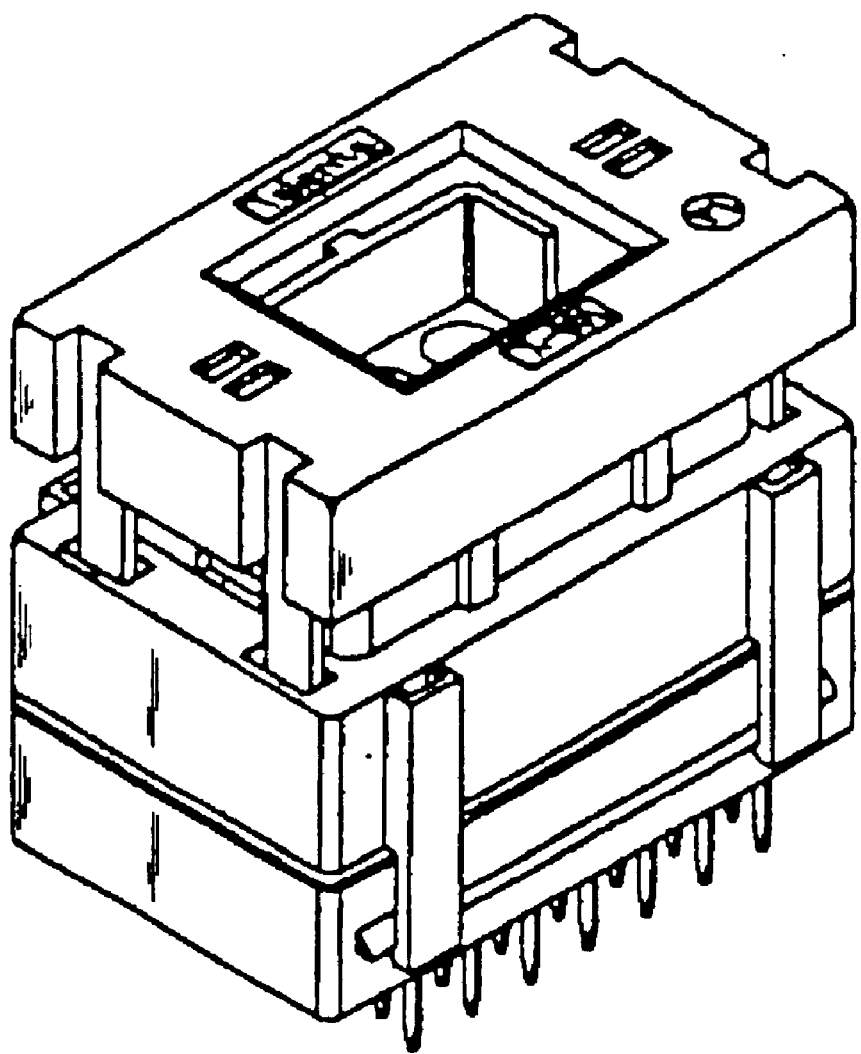
FIG. 1 shows a perspective view of an IC socket of the prior art.
Figure 2:
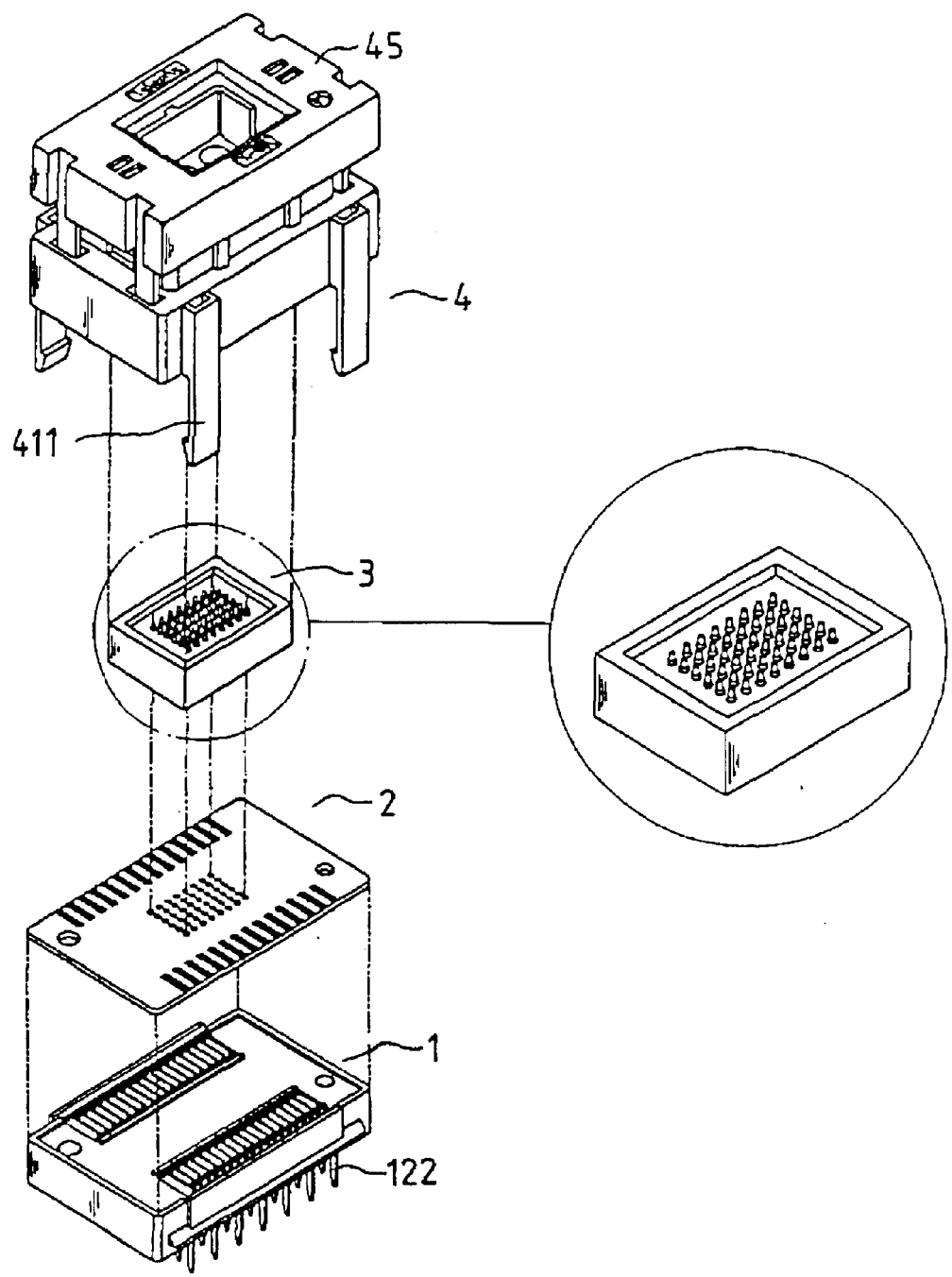
FIG. 2 shows an exploded view of the preferred embodiment of the present invention.
Figure 3:
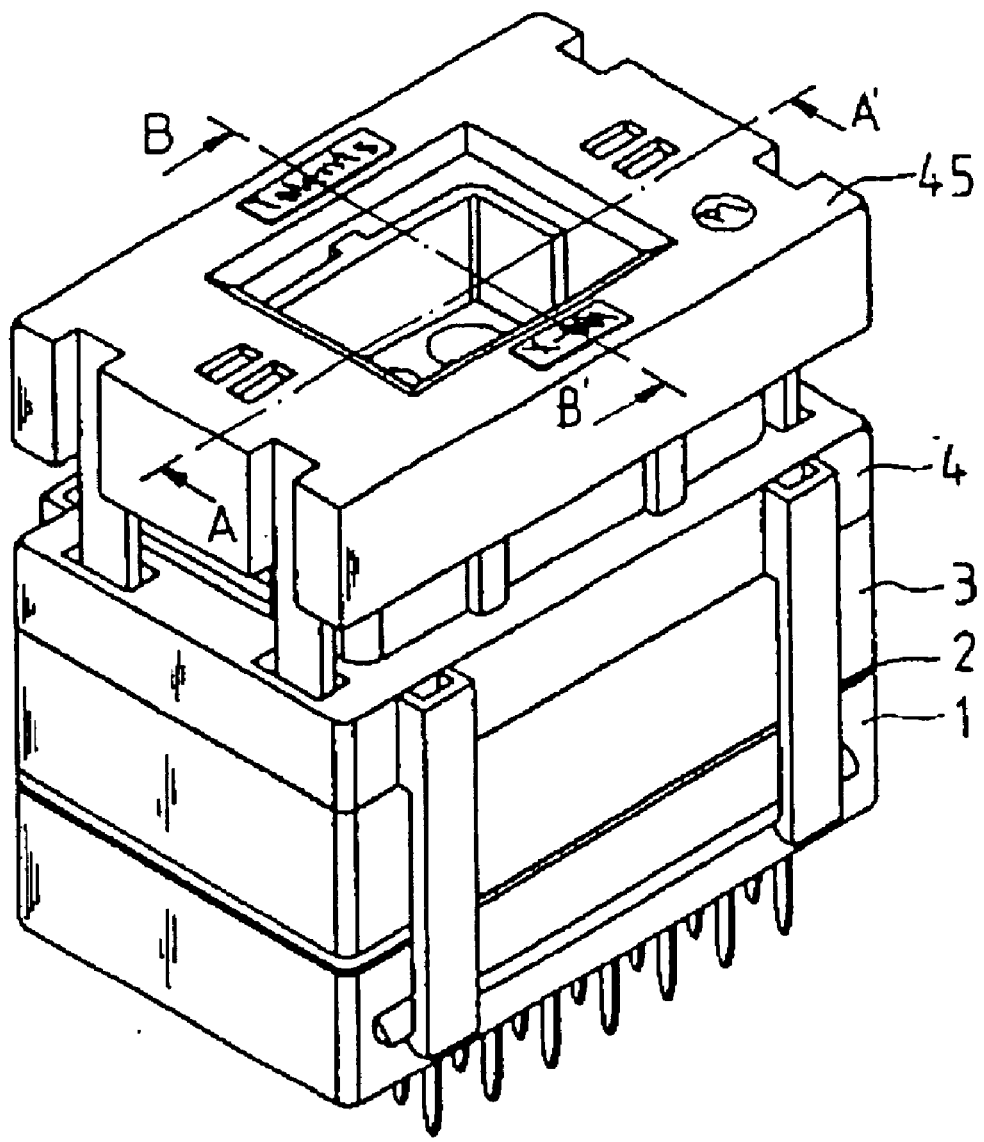

FIG. 3 shoes a perspective view of the preferred embodiment of the present invention in combination.

Figure 4:
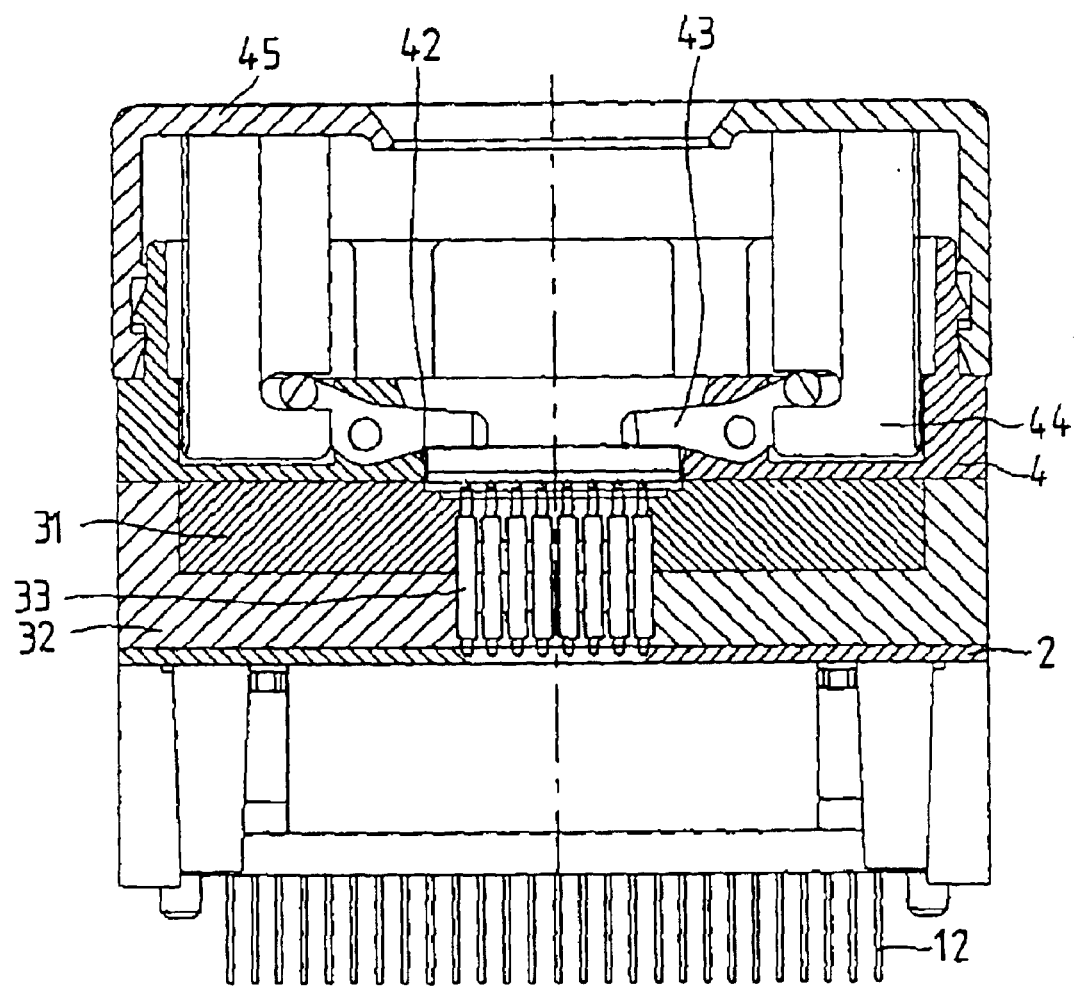

FIG. 4 shows a sectional view taken along the direction indicated by a line A–A' as shown in FIG. 3.

FIG. 5 shows a sectional view taken along direction indicated by a line B–B' as shown in FIG. 3.

FIG. 6 shows a partial sectional view of the base unit of the preferred embodiment of the present invention.

FIG. 7 shows a schematic plan view of the underside of the interposer of the preferred embodiment of the present invention.

FIG. 8 shows a schematic view of the adapter unit of the preferred embodiment of the present invention in action.

FIG. 9 shows a sectional schematic view of the preferred embodiment of the present invention at work such that an IC is in contact with the interposer via the POGO pin unit.

DETAILED DESCRIPTION OF THE PREFERRED EMBODIMENT

As shown in FIGS. 2–9, a modular socket embodied in the present invention comprises a base unit 1, an interposer 2, a POGO pin unit 3, and an adapter unit 4.

The base unit 1 is formed of a base 11 and a plurality of contact terminals 12. The base 11 is provided with a plurality of slots 111 for disposing the contact terminals 12. Located at the contact place of the contact terminal 12 and the slot 111 is a retaining hook 121 by which the contact terminal 12 is held in the slot 111 such that a pin 122 of the contact terminal 12 is jutted out of the base 11 to fasten to a test circuit board (not shown in the drawings) by soldering. The contact terminal 12 is provided with an S-shaped suspension arm 123 which is in turn provided at a top end which is in turn provided at a top end thereof with a bell-shaped contact head 124.

The interposer 2 is designed in accordance with the specifications of an integrated circuit to be tested. The interposer 2 is detachably fastened to the top of the base unit 1 by a plurality of locating pins (not shown in the drawings) which are fastened through the interposer 2 and the base unit 1. The interposer 2 is provided in two sides of an underside thereof with a plurality of copper poise packing pieces 21, which are in an intimate contact with the bell-shaped contact heads 124 of the base unit 1. The bell shape of the contact heads 124 serves to increase a contact area. The interposer 2 is provided in a predetermined position thereof with a plurality of pin holes 22, which are connected with the corresponding copper poise packing pieces 21 by a bonding wire 23, as shown in FIG. 7.

The POGO pin unit 3 is adjustable in pin umber and pin pitch in accordance with the specifications of an integrated circuit to be tested. The POGO pin unit 3 is fastened to the top of the interposer 2 by means of locating pins (not shown in the drawings). The POGO pin unit 3 is formed of an upper cover 31, a lower cover 32, and a plurality of elastic pins 33. The upper cover 31 is provided with a plurality of locating holes 311, whereas the lower cover 32 is provided with a plurality of locating holes 321 corresponding to the locating holes 311 of the upper cover 31. The locating holes are used to locate the elastic pins 33 at an interval such that an upper contact pin 331 of the elastic pins 33 is jutted out of the locating hole 311 of the upper cover 31, and that a lower contact pin 333 of the elastic pin 33 is jutted out of the locating hole 321 of the lower cover 32 to come in contact with the pin hole 22 of the interposer 2. The upper cover 31 and the lower cover 32 are held together by means of locating pins (not shown in the drawings). The elastic pins 33 are provided with a spring 332 fitted therecover. The spring 332 serves to reduce the contact impedance by virtue of the fact that the spring 332 can offset a poor contact which is resulted from a poor planar surface. The end of the upper contact pin 331 is of an arcuate construction and is therefore capable of embracing a pin tin ball 51 of an integrated circuit 5, as shown in FIG. 9. As a result, the likelihood of the pin tin ball 51 being damaged or jammed is reduced to a minimum.

The adapter unit 4 has an adapter seat 41 adjustable in accordance with the specifications of an integrated circuit to be tested. The adapter seat 41 is provided in a predetermined position thereof with a plurality of retaining legs 411 and is securely mounted on the top of the POGO pin unit 3 such that the bottom ends of the retaining legs 411 of the adapter seat 41 catch the outer edges of the base unit 1. The adapter seat 41 is provided with an integrated circuit seat 42 of a hollow construction. The upper contact pins 331 are extended into the integrated circuit seat 42. The integrated circuit seat 42 is provided with a plurality of pressure arm 43 which is retained by a press block 44 capable of an up-and-down motion. The adapter seat 41 is provided in the upper portion thereof with a plurality of retaining projections (not shown in the drawings) for retaining a top cap 45 which is provided in the inner side with a plurality of guide pins 46 each being located between the top cap 45 and the press block 44 and provided with a spring 47 fitted thereover, as shown in FIG. 8. As the top cap 45 is exerted on by an external force, the guide pins 46 are forced downward to press against the press blocks 44, thereby causing the press blocks 44 to move downward to enable the pressure arms 43 to swivel upward. As soon as the top cap 45 is relieved of the external force, the spring force of the springs 47 cause the pressure arms 43 to swivel back to the original position.

The guide pins 46 and the springs 47 of the top cap 45 are driven by the external force to move downward along a slide slot 48 of the integrated circuit seat 42 such that the spring force of the springs 47 exert evenly on the integrated circuit 5.

In operation, the top cap 45 is exerted on by a force such that the pressure arm 43 are caused to swivel upward. In the meantime, the integrated circuit 5 is disposed in the IC seat 42 such that the integrated circuit 5 is held securely by the frame of the IC seat 42. As the top cap 45 returns to its original position, the pressure arm 43 swivel downward to press against the integrated circuit 5. In view of the fact that the pin tin ball 51 of the integrated circuit 5 is embraced by the upper contact pin 331 of the elastic pins 33 and that the lower contact pin 332 of the elastic pins 33 is in contact with the pin hole 22 of the interposer 2, and that the pin hole 22 is connected with the copper poise packing piece packing piece 21 by the bonding wire 23, and that the copper poise packing piece 21 is in contact with the bell-shaped contact head 124 of the contact terminal 12, the pin tin ball 51 of the integrated circuit 5 is electrically connected with the pin 122 of the contact terminal 12, thanks to the electrical conductivity of the elastic pins 33 and the interposer 2. The electricity or signal of each pin tin ball 51 of the integrated circuit 5 is thus transmitted to the test circuit board to which the pins 122 are fastened by soldering.

The advantages of the present invention are thus apparent. In the first place, the present invention is provided with a plurality of elastic pins, each having an arcuate upper contact pin for protecting the pin tin ball of an integrated circuit to be tested. The modular socket of the present invention is formed of the base unit, the interposer, the POGO pin unit, and the adapter unit, which are detachably fastened together and can be therefore replaced independently. In addition, the modular socket of the present invention is versatile in design in that the interposer and the POGO pin unit of the modular socket can be easily replaced to facilitate the testing of the integrated circuit of various specifications. Furthermore, the adapter unit of the modular socket of the present invention can be replaced independently to suit with the integrated circuits of various dimensions. In short, the modular socket of the present invention is cost-effective and compatible with various IC tests.

The embodiment of the present invention described above is to be regarded in all respects as being illustrative and nonrestrictive. Accordingly, the present invention may be embodied in other specific forms without deviating from the spirit thereof. The present invention is therefore to be limited only by the scopes of the following appended claims.

What is claimed is:

1. A modular socket for testing an integrated circuit, comprising:
   a base unit having a base, a plurality of contact terminals in disposed on said base wherein a pin of said plurality of contact terminals is extended out of said base to fasten with a test circuit board;

an interposer having a plurality of copper poise packing pieces on an underside thereof, said interposer being detachably mounted on a top side of said base unit such that said plurality of copper poise packing pieces are in intimate contact with a top end of said plurality of contact terminals, said interposer further comprising a plurality pin holes as a predetermined position wherein said pin holes are connected to said plurality of copper poise packing pieces by a bonding wire, a POGO pin unit detachably fastened on top of said interposer and comprising a cover and a plurality of elastic pins disposed in said cover with a spring fitted thereover, each of said plurality of elastic pins having an upper contact pin and a lower contact pin, said upper contact pin being jutted out of an upper side of said cover, and said lower contact pin being jutted out of an underside of said cover to come in contact with one of said pin holes of said interposer, an adapter unit having an adapter seat detachably fastened to a top surface of said POGO pin unit and comprising a hollow seat configured and dimensioned to accommodate the integrated circuit being tested, said upper contact pins of said elastic pins of said POGO pin unit being extended into said hollow seat of said adapter seat to come into contact with pin tin balls of the integrated circuit, said hollow seat having a frame for retaining said integrated circuit securely.

2. The modular socket of claim 1, wherein said base unit further comprises a plurality of slots, wherein said contact terminals are each provided with a retaining hook disposed in said slots such that each of said retaining hook of said contact terminal is caught in said slots so as to locate securely said contact terminals in said slot.

3. The modular socket of claim 1, wherein said contact terminals are provided with an S-shaped suspension arm wherein said suspension arm is provided with a bell-shaped contact head at a top end thereof and is in contact with said plurality of copper poise packing pieces.

4. The modular socket of claim 1, wherein said cover of said POGO pin unit is formed of an upper cover and a lower cover, said upper cover comprising a plurality of locating holes, said lower cover comprising a plurality of locating holes corresponding in location to said upper cover locating holes, wherein said elastic pins of said POGO pin unit are located by said locating holes of said upper cover and said locating holes of said lower cover such that said upper contact pins of said elastic pin are jutted out of said upper cover locating holes, and said lower contact pins of said elastic pin are jutted out of said lower cover locating holes, and wherein said upper cover and lower cover are secured together.

5. The modular socket of claim 4, wherein said upper contact pins each has an arcuate top wherein said upper contact pins come into contact with the pin tin balls of said integrated circuit such that said arcuate top of each of said upper contact pins embraces each of the pin tin balls of the integrated circuit.

6. The modular socket of claim 5, wherein said adapter seat of said adapter unit is provided with a plurality of retaining legs wherein said retaining legs detachable fasten with said adapter unit.

7. The modular socket of claim 6, further comprising a top cap having a plurality of guide pins on an inner side thereof, each of said plurality of guide pins having a spring fitted thereover, wherein said guide pins are located between said top cap and a press block of said integrate circuit such that said guide pins are forced downward to press against the press block by an external force exerting on said top cap.

8. The modular socket of claim 7, wherein said hollow seat of said adapter comprises a plurality of slide slots corresponding in location and number to said guide pins of said top cap wherein each of said guide pins slides along with said spring thereof in one of said slide slots.

* * * * *